United States Patent

Bando et al.

Patent Number: 5,953,624
Date of Patent: Sep. 14, 1999

[54] BUMP FORMING METHOD

[75] Inventors: Akio Bando, Tachikawa; Motohiko Katoh, Higashikurume; Hirofumi Moroe, Musashimurayama, all of Japan

[73] Assignee: Kabushiki Kaisha Shinkawa, Tokyo, Japan

[21] Appl. No.: 09/005,788

[22] Filed: Jan. 12, 1998

[30] Foreign Application Priority Data

Jan. 13, 1997 [JP] Japan .................................. 9-014797

[51] Int. Cl.⁶ .................................................. H01L 21/44
[52] U.S. Cl. ...................... 438/617; 438/612; 228/180.5
[58] Field of Search .................... 438/612, 613, 438/617; 228/179.1, 180.1, 180.21, 180.22, 180.5

[56] References Cited

U.S. PATENT DOCUMENTS

| | | | |
|---|---|---|---|
| 5,395,037 | 3/1995 | Takahashi et al. .................... | 228/180.5 |
| 5,559,054 | 9/1996 | Adamjee .................................. | 438/617 |
| 5,633,204 | 5/1997 | Tago et al. .............................. | 438/617 |
| 5,686,353 | 11/1997 | Yagi et al. ............................... | 438/617 |
| 5,723,364 | 3/1998 | Nakamura et al. ...................... | 438/617 |
| 5,740,956 | 4/1998 | Seo et al. ................................. | 438/617 |

FOREIGN PATENT DOCUMENTS

H6-95519  11/1994  Japan .

*Primary Examiner*—Kevin M. Picardat
*Attorney, Agent, or Firm*—Koda & Androlia

[57] ABSTRACT

A method for forming a bump on, for instance, an electrode of a semiconductor device out of a wire comprising the steps of forming a ball at the end of the bonding wire, pressing the ball against the electrode, and separating the ball from the wire by cutting the wire by a pair of cutters that advance toward each other along the diameter of the wire. The cut surface of the ball or the bump can be flattened by the cutters that presses the cut surface.

2 Claims, 2 Drawing Sheets

BUMP FORMING METHOD

BACKGROUND OF THE INVENTION

1. Field of the Invention

The present invention relates to a method for forming bumps on the electrodes of semiconductor devices.

2. Prior Art

Bumps are generally formed on electrodes of semiconductor devices by a wire bonding apparatus. When such bumps (which are connected to, for instance, terminals) are made out of a wire, it is important to cut the wire consistently at the same position. Various methods have been proposed for this purpose. However, all of these methods have respective advantages and disadvantages. The method disclosed in, for instance, Japanese Patent Application Publication (Kokoku) No. 6-95519 is for cutting wire at consistently the same position, and this method is shown FIG. 2.

In step (a) of FIG. 2, with a clamper 3 closed, a ball 6 is formed by an electrical discharge on the tip end of a wire 5 which passes through a capillary 4. Then, the clamper 3 is opened, and the capillary is lowered so that the ball 6 is pressed against the surface of an electrode 2 on a semiconductor device 1 as shown in step (b).

After this, the capillary is raised as shown in step (c); and a cutting jig 11 which has a sharp edge 10 advances so that a cut 7 is formed at the root of the ball 6.

When the cut 7 has thus ben made, the cutting jig 11 withdraws; and at the same time, the clamper 3 is closed to hold the wire 5, and the clamper 3 and capillary 4 are both raised in step (d). As a result, the wire 5 breaks at the cut 7, so that a bump 8 is formed on the electrode 2.

Next, a pressing member 12 is caused to advance horizontally as shown in step (e) and is then lowered so that a prescribed pressure is applied to the bump 8 in step (f). As a result, the upper surface of the bump 8 is formed into a flattened portion 9 by the pressing member 12 in step (g).

In the prior art described above, the cut 7 is formed from one side (right side in FIG. 2) by the cutting jig 11. As a result, the portion of the wire 5 above the cut 7 can be easily deformed. Furthermore, so as to form the flattened portion 9 on the bump 8 following breaking of the wire, operating time is required in order to advance and then lower the pressing member 12. Moreover, a means for operating the pressing member 12 is required, thus making the apparatus more complicated.

SUMMARY OF THE INVENTION

Accordingly, it is an object of the present invention to provide a bump forming method in which deformation of the wire can be prevented following the breaking of the wire, and which makes it possible to simplify the apparatus and shorten the bump forming time.

The object of the present invention is accomplished by a unique method in which a ball is formed on the tip end of a wire passing through a capillary, this ball is pressed against the electrode of a semiconductor device, the capillary is raised, and then a root portion of the ball is cut by a pair of cutters from both sides of the wire, thus forming a bump on the electrode.

The object of the present invention is further accomplished by another unique method in which a ball is formed on the tip end of a wire passing through a capillary, this ball is pressed against the electrode of a semiconductor device, the capillary is raised, and then a root portion of the ball is cut by a pair of cutters from both sides of the wire, thus forming a bump on the electrode, and in addition the upper surface of the bump is pressed by the undersurfaces of the cutters so as to flatten the top surface of the bump.

DETAILED DESCRIPTION OF THE INVENTION

Figure 1:
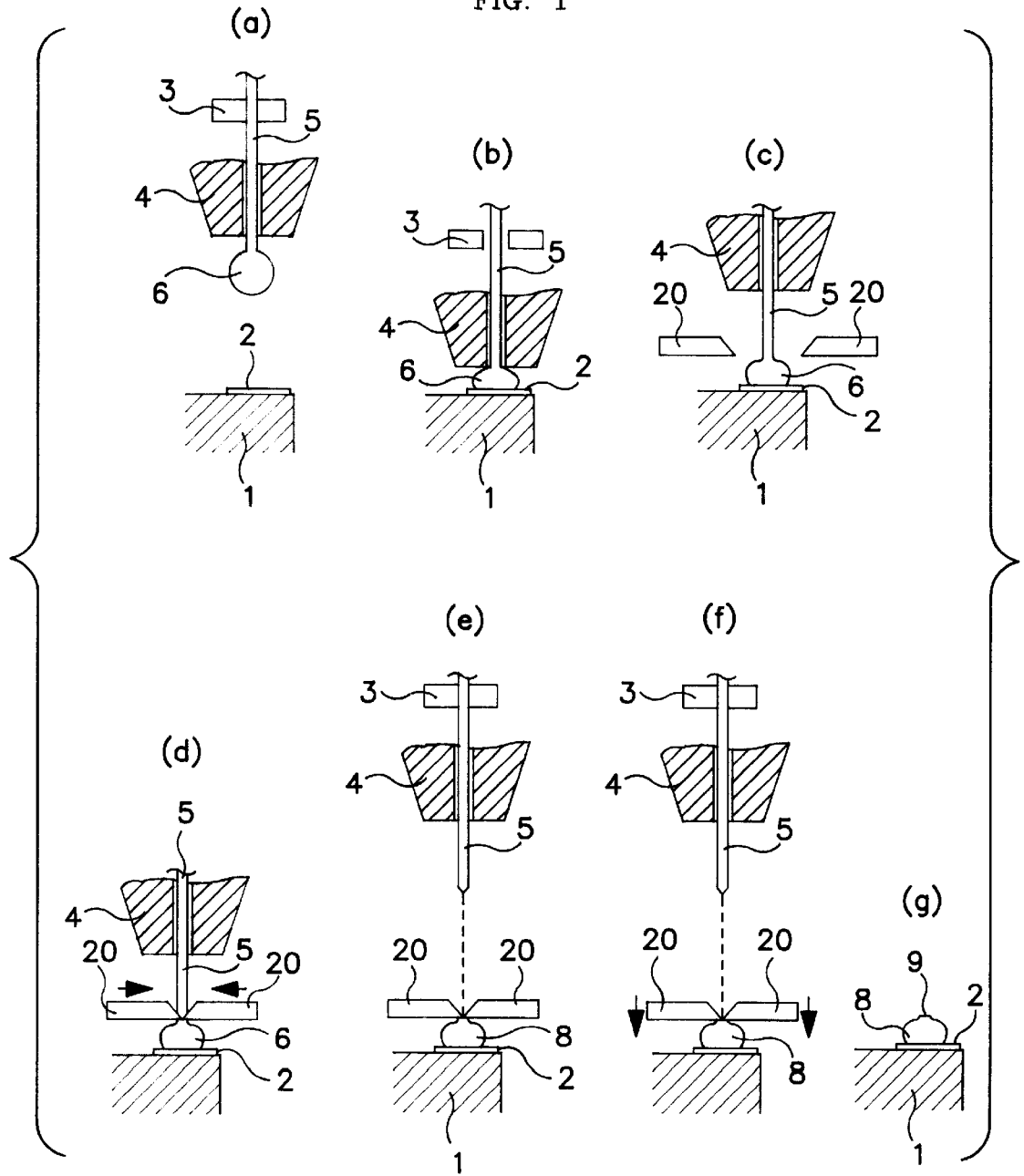
FIG. 1 shows the steps of the bump forming method according to one embodiment of the present invention.
Figure 2:
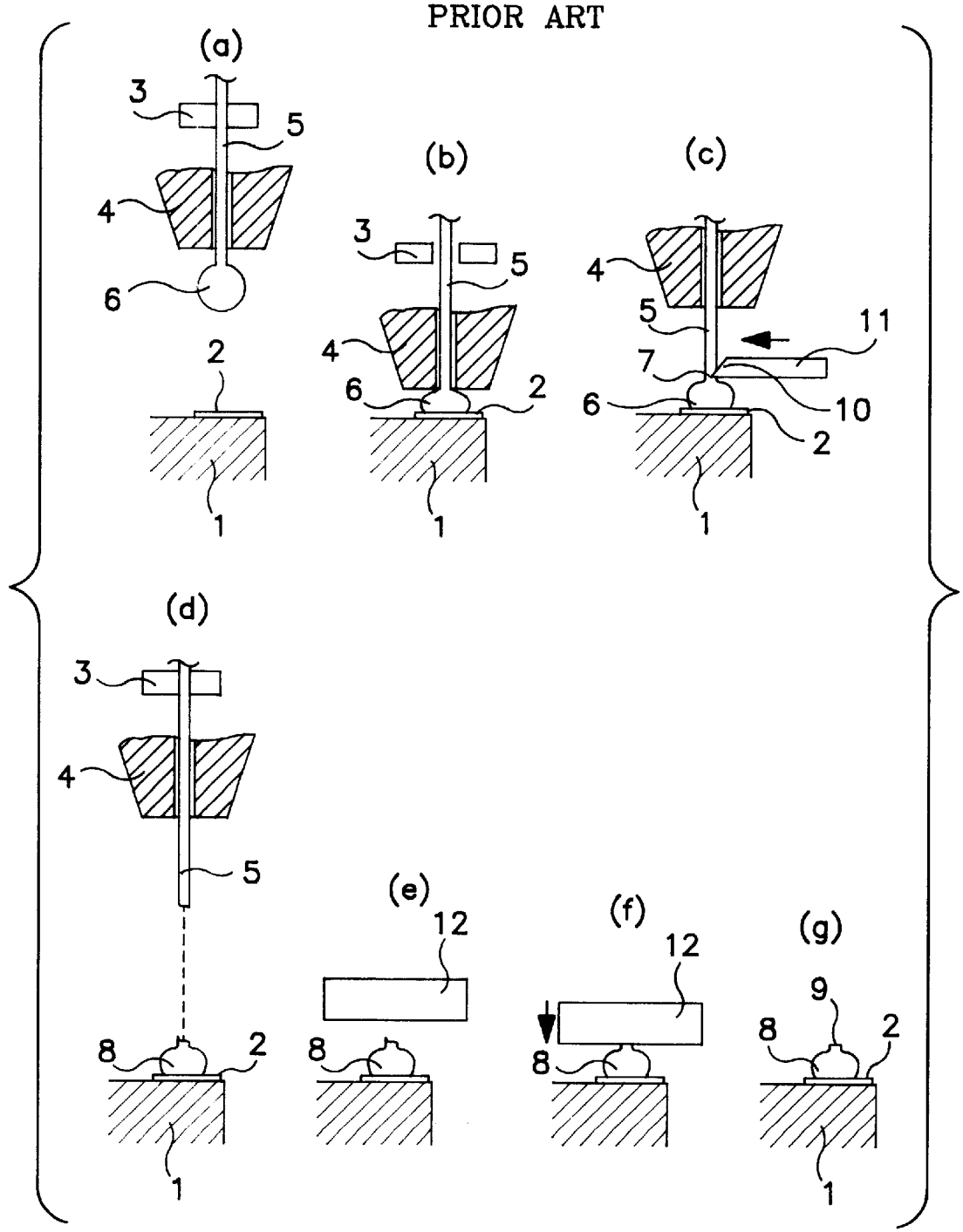
FIG. 2 shows the steps of the conventional bump forming method.

In FIG. 1, in step (a), while a clamper 3 maintained in a closed state, a ball 6 is formed by an electrical discharge on the tip end of a wire 5 which passes through a capillary 4.

Next, the clamper 3 is opened, and the capillary 4 is lowered so that the ball 6 is pressed by the capillary 4 against the surface of an electrode 2 on a semiconductor device 1 in step (b); and then the capillary 4 is raised in step (c). The operation so far is the same as in a conventional method.

Next, as shown in step (d), a pair of cutters 20, which are installed so as to face each other advance toward each other from opposite directions, are closed; as a result, the pointed edges formed on the cutters 20 cut the wire 5 at the root portion of the ball 6. Thus, the ball 6 is separated from the wire 5 by the cutters 20. Then, in step (e), the clamper 3 is closed so as to hold the wire 5 in between; and the clamper 3 and capillary 4 are raised together. As a result, a bump 8 is formed or left on the electrode 2.

As shown in step (f), after the wire cutting operation above, the cutters 20, which preferably have flat undersurfaces, are lowered while still closed, thus applying a prescribed pressure to the bump 8. As a result, the upper portion of the bump 8 is formed into a flattened surface 9 by the undersurfaces of the cutters 20 as shown in step (g).

Thus, since the root portion of the ball 6 is cut by the pair of cutters 20 from both sides thereof in a direction of the diameter so as to be separated from the wire 5, no deformation occurs in the wire 5. Furthermore, since the flattened surface 9 is formed merely by lowering the cutters 20 after the wire 5 is cut by the cutters 20, the apparatus is simple in structure, and the bump formation time can be shortened.

In the above embodiment, the cutters 20 are lowered after the wire 5 has been cut by the cutters 20. However, since the bump 8 may have a flat top surface after the cutting operation by the cutters 20, it would be possible to omit the lowering of the cutter 20 and pressing of the bump 8 by the cutter 20. Nonetheless, when the cutters 20 are lowered as described above, flat upper surfaces can be more consistently formed on the bumps, and such bumps can have a higher flatness.

As seen from the above, according to the present invention, a bump is formed on the electrode by cutting the root portion of the ball formed at the end of the wire from both sides thereof by a pair of cutters. Accordingly, no wire deformation occurs following the cutting of the wire. Furthermore, the structure for performing the operations can be simplified, and the bump formation time can be shortened.

What is claimed is:

1. A bump forming method comprising the steps of:

forming a ball at a tip end of a wire passing through a capillary;

pressing said ball against an electrode of a semiconductor device;

raising said capillary; and cutting a root portion of said ball by a pair of cutters from both sides of said wire so as to form a bump on said electrode.

2. A method for forming a bump on an electrode of a semiconductor device comprising the steps of:

forming a ball at an end of a wire that passes through a capillary;

pressing said ball by said capillary against said electrode of said semiconductor device;

releasing said capillary from said ball;

separating said ball from said wire by a pair of cutting means that advance toward each other from opposite directions, thus forming said bump on said electrode.

* * * * *